US008441105B2

(12) United States Patent
Sato et al.

(10) Patent No.: US 8,441,105 B2
(45) Date of Patent: May 14, 2013

(54) SEMICONDUCTOR DEVICE, WAFER STRUCTURE AND METHOD FOR FABRICATING SEMICONDUCTOR DEVICE

(75) Inventors: Yoshihiro Sato, Tokyo (JP); Takehiko Nomura, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 47 days.

(21) Appl. No.: 12/437,088

(22) Filed: May 7, 2009

(65) Prior Publication Data

US 2009/0278236 A1    Nov. 12, 2009

(30) Foreign Application Priority Data

May 8, 2008   (JP) ................. 2008-122513

(51) Int. Cl.
*H01L 23/544*   (2006.01)
*H01L 21/00*    (2006.01)

(52) U.S. Cl.
USPC ............. 257/620; 438/33; 438/68; 438/113; 438/460

(58) Field of Classification Search .......... 257/620, 257/E23.179, E21.599; 438/462, 33, 68, 438/113, 114, 460
See application file for complete search history.

(56) References Cited

U.S. PATENT DOCUMENTS

| 5,213,994 | A | * | 5/1993 | Fuchs | 438/421 |
|---|---|---|---|---|---|
| 5,422,286 | A | * | 6/1995 | Yang | 438/133 |
| 6,724,084 | B1 | * | 4/2004 | Hikita et al. | 257/737 |
| 2003/0181045 | A1 | * | 9/2003 | Minn et al. | 438/689 |
| 2003/0216009 | A1 | * | 11/2003 | Matsuura et al. | 438/460 |
| 2005/0221601 | A1 | * | 10/2005 | Kawano | 438/622 |
| 2006/0006493 | A1 | * | 1/2006 | Kawano et al. | 257/510 |
| 2006/0278957 | A1 | * | 12/2006 | Lin et al. | 257/620 |
| 2008/0064186 | A1 | * | 3/2008 | Imori | 438/462 |
| 2009/0200568 | A1 | * | 8/2009 | Horie | 257/98 |
| 2009/0201043 | A1 | * | 8/2009 | Kaltalioglu | 324/765 |
| 2011/0204417 | A1 | * | 8/2011 | Sato | 257/190 |
| 2011/0204488 | A1 | * | 8/2011 | Itou et al. | 257/622 |

FOREIGN PATENT DOCUMENTS

JP    09330891    12/1997

* cited by examiner

*Primary Examiner* — Cheung Lee
*Assistant Examiner* — Jeremy Joy
(74) *Attorney, Agent, or Firm* — Turocy & Watson, LLP

(57) ABSTRACT

A semiconductor device includes an element forming region including at least one semiconductor element formed on at least one compound semiconductor layer formed on a substrate and a trench formed between an outer edge of the semiconductor device and the element forming region. The trench spatially separates the compound semiconductor layer, and the trench is formed at least to reach the substrate.

14 Claims, 11 Drawing Sheets

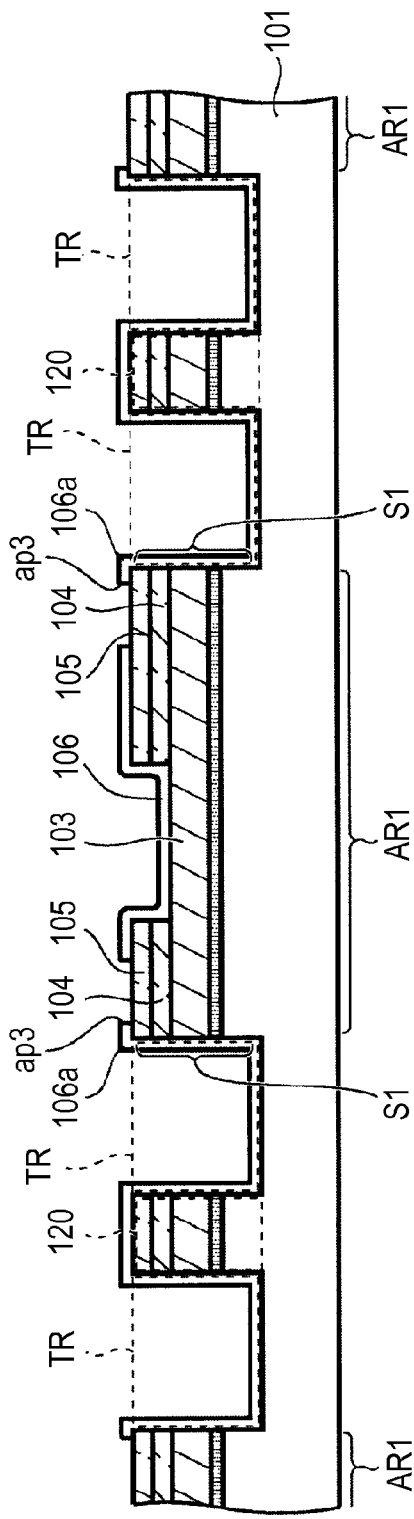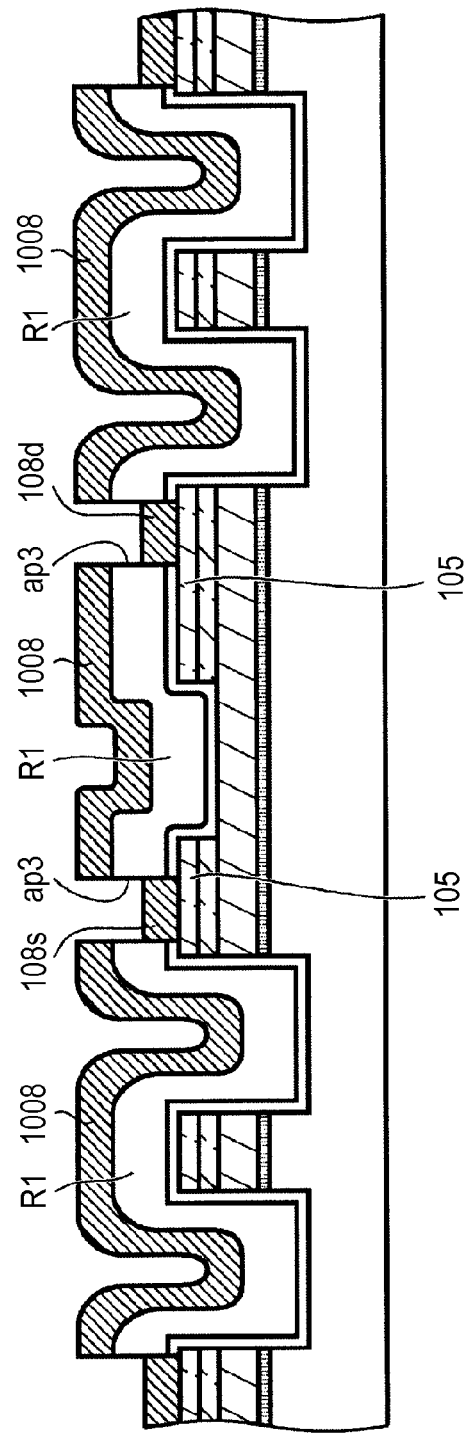

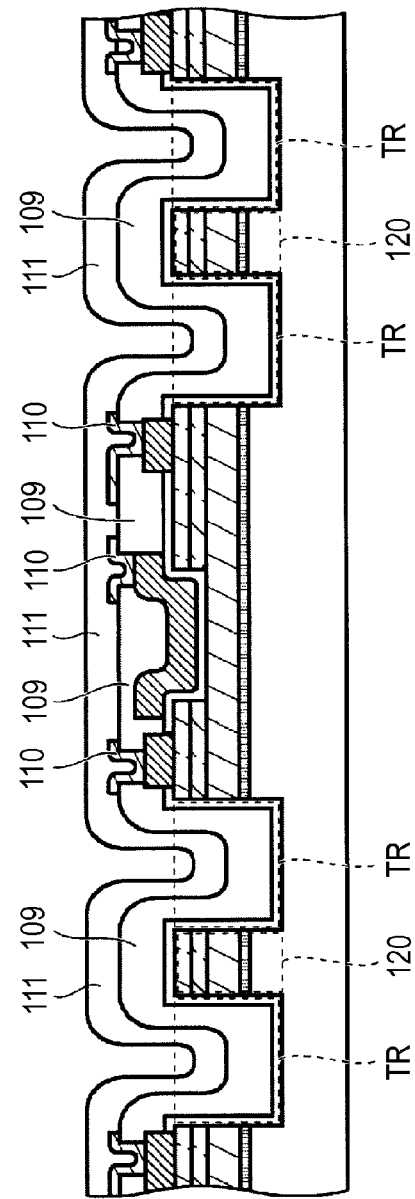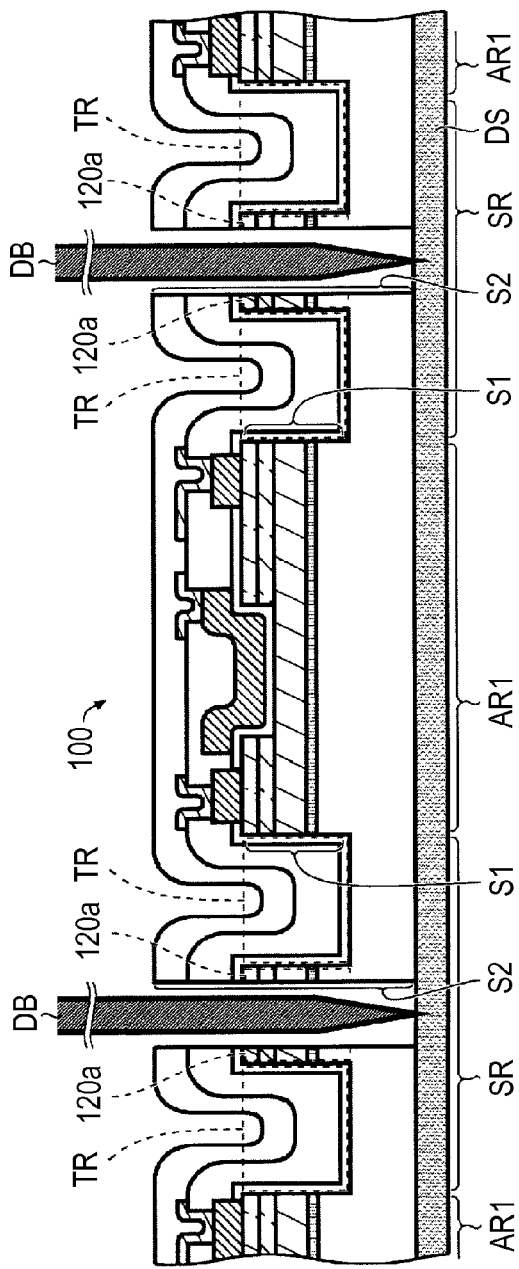

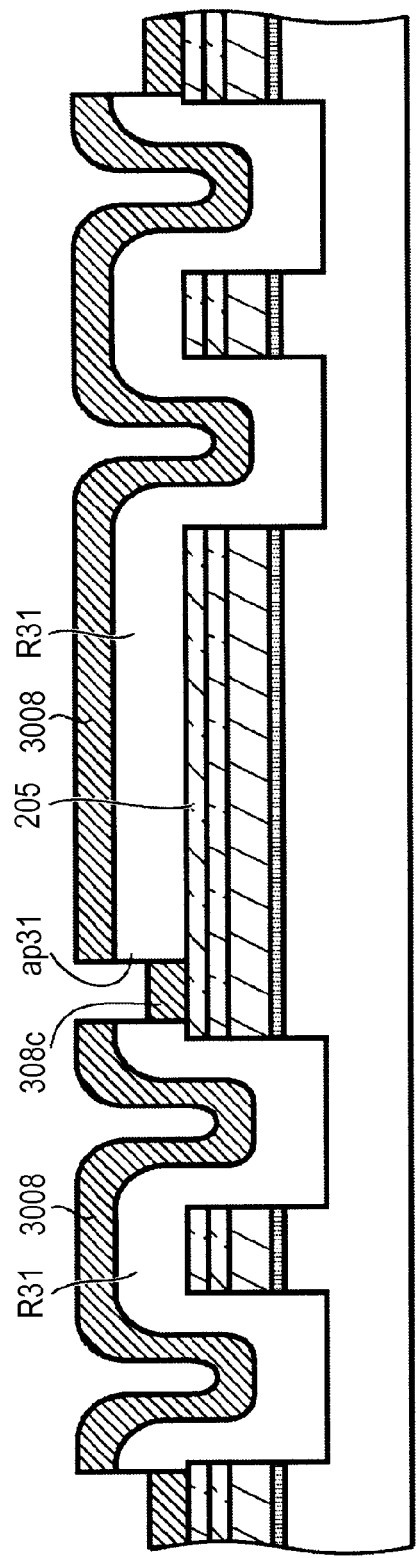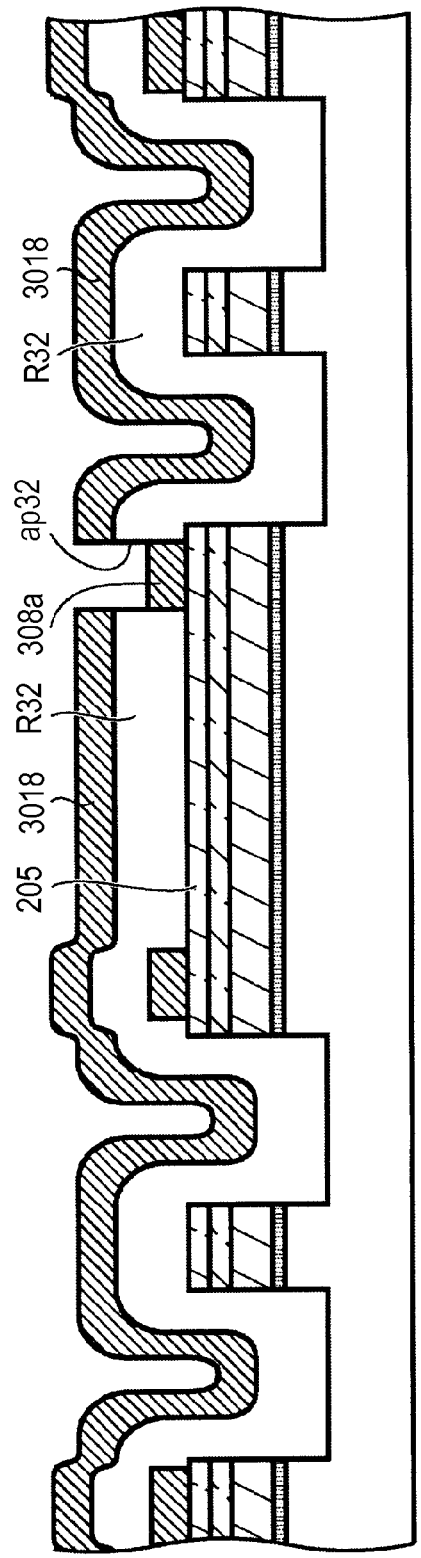

SEMICONDUCTOR DEVICE, WAFER STRUCTURE AND METHOD FOR FABRICATING SEMICONDUCTOR DEVICE

CROSS-REFERENCE TO RELATED APPLICATIONS

This application claims priority to Japanese patent application serial No. 2008-122513, filed on May 8, 2008, the entire content of which is incorporated herein by reference.

BACKGROUND OF THE INVENTION

1. Field of the Invention

The present invention relates to a semiconductor device, a wafer structure and a method for fabricating the semiconductor device and more specifically to the semiconductor device, the wafer structure and the method for fabricating the semiconductor device using compound semiconductors.

2. Description of the Photo-Resist Related Art

Conventionally, a WCSP (Wafer-Level Chip Size Packaging) technique is used in general in fabricating semiconductor devices to accommodate to semiconductor devices whose size and weight are reduced. The WCSP separates the semiconductor devices into individual chips by dicing the wafer after forming rewiring layers and passivation layers in a state of the wafer. In dicing the wafer, a trench whose width is wider than a dicing blade is formed along a scribing region that is a part to be cut and a bottom of the trench is cut by a dicer in an array direction as disclosed in Japanese Patent Application Laid-open No. Hei. 9-330891 for example. A silicon oxide film is used in general as a mask in forming the trench due to its easiness in forming the film and its cost.

In addition, semiconductor elements using various compound semiconductors such as III-V group semiconductors and II-VI group semiconductors are being developed lately because it has become possible to form various semiconductor elements and because it is required to operate and drive semiconductors more quickly at low voltage.

While the compound semiconductors described above are used to form semiconductor elements such as a MOSFET (Metal Oxide Semiconductor Field Effect Transistor), a HEMT (High Electron Mobility Transistor) and a SBD (Schottky Barrier Diode) for example, a metal film such as aluminum (Al) is normally used as an electrode material such as a gate electrode and others due to its low fabrication cost and its easiness of the fabrication process. However, because the metal film of this sort is soluble in etchant such as hydrofluoric acid used in etching a silicon oxide film used as a mask, the metal film causes problems that it complicates a fabrication process and limits a degree of freedom in selecting materials if the trench to be cut is formed in the scribing region after forming the various electrodes.

The prior art fabrication method is thus arranged to form the trench in the scribing region before forming the various electrodes from the reasons as described above. However, if the process (referred to as a microfabrication process hereinafter) that requires such a relatively fine fabrication process of forming the various electrodes is placed behind the process of forming the trench, there exists the trench whose width is larger than a thickness of the dicing blade or a diameter of a spot of a laser cutter for example at the time of the microfabrication process. This causes a problem that a photo-resist used in photolithography in the microfabrication process cannot be formed uniformly.

SUMMARY OF THE INVENTION

According to one aspect of the present invention, there is provided a semiconductor device including an element forming region including at least one semiconductor element formed on at least one compound semiconductor layer formed on a substrate and a trench formed between an outer edge of the semiconductor device and the element forming region. The trench spatially separates the compound semiconductor layer, and the trench is formed at least to reach the substrate.

According to another aspect of the present invention, there is provided a wafer structure formed of at least one compound semiconductor layer on a substrate. The wafer structure includes a plurality of element forming regions each including at least one semiconductor element; a plurality of scribing regions respectively disposed between two adjacent element forming regions; two parallel trenches formed in each of the scribing regions for spatially separating the compound semiconductor layer between neighboring element forming regions; and a mesa portion formed by the two parallel trenches. The trenches are formed at least to reach the substrate.

BRIEF DESCRIPTION OF THE DRAWINGS

FIGS. 4A and 4B are process diagrams (part 2) showing the method for fabricating the semiconductor devices according to the first embodiment of the invention;

FIGS. 6A and 6B are process diagrams (part 4) showing the method for fabricating the semiconductor devices according to the first embodiment of the invention;

FIGS. 11A and 11B are process diagrams showing a method for fabricating the semiconductor devices according to the third embodiment of the invention.

BEST MODES FOR CARRYING OUT THE INVENTION

Best modes for carrying out the invention will be explained in detail below with reference to the drawings. It is noted that the modes described below should not be construed as what limit the invention. Still more, each drawing merely schematically shows shapes, sizes and positional relationships of respective parts of a device to a degree that allows contents of the invention to be understood, so that the invention is not limited by the shapes, sizes and positional relationships illustrated in each drawing. Further, a part of hatching in a cross-section is omitted in each drawing in order to clearly show a structure of the device. In addition, numerical values described later are merely preferable exemplary values of the invention, so that the invention is not limited by the exemplified numerical values.

First Embodiment

A semiconductor device 100 of a first embodiment of the invention will be explained below in detail with reference to the drawings. It is noted that the semiconductor device 100 in which one or more MOSFETs 100A are formed as semiconductor elements will be exemplified in the present embodiment.

(Structure)

Figure 1A:
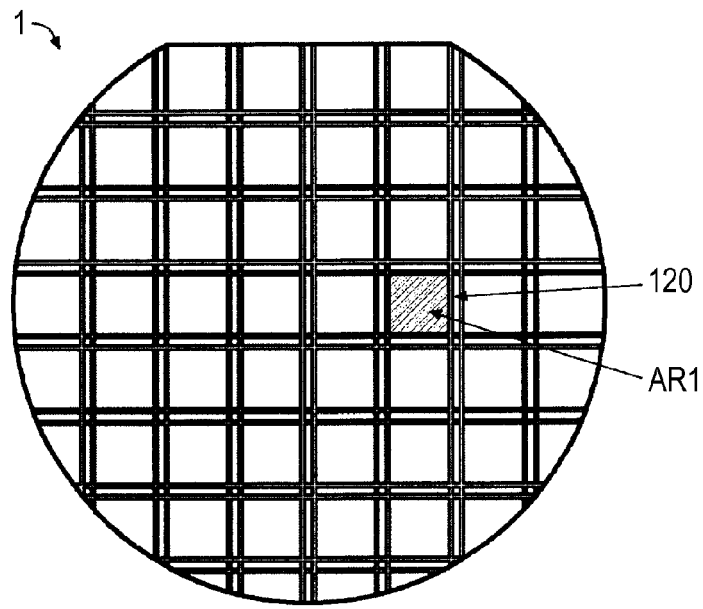
FIG. 1A is a top view showing a schematic structure of a wafer before separating semiconductor devices according to a first embodiment of the invention and FIG. 1B is a schematic enlarged view thereof.
Figure 1B:
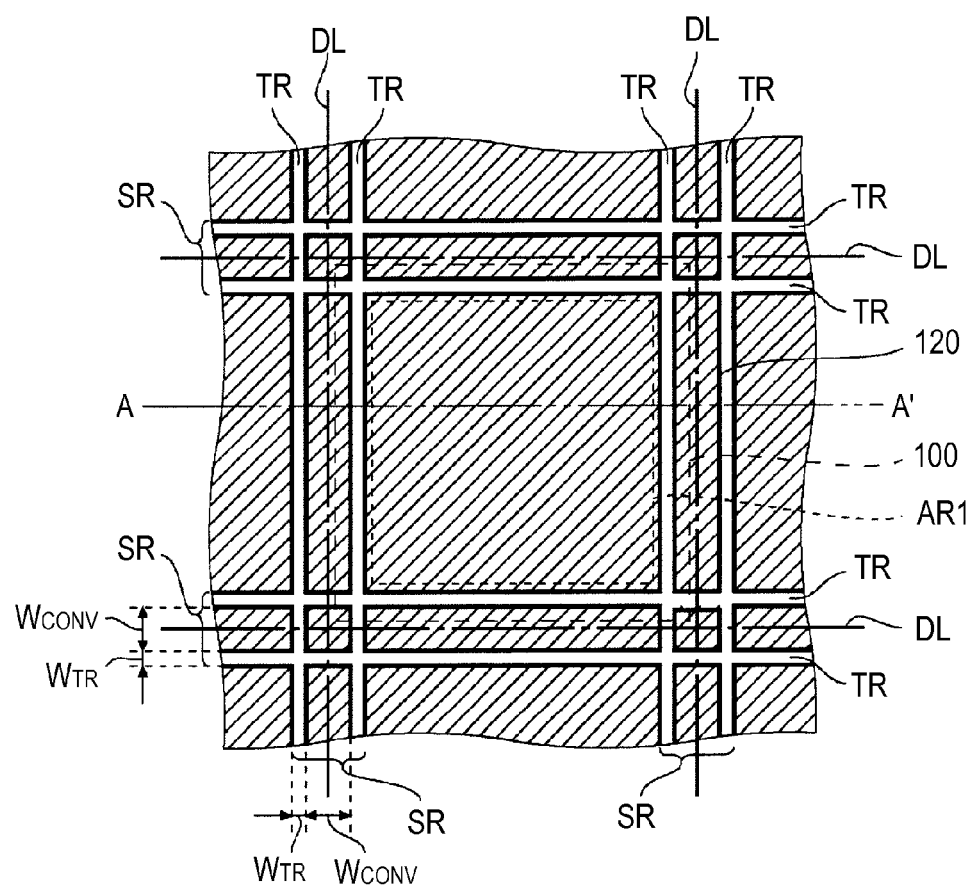
Figure 2:
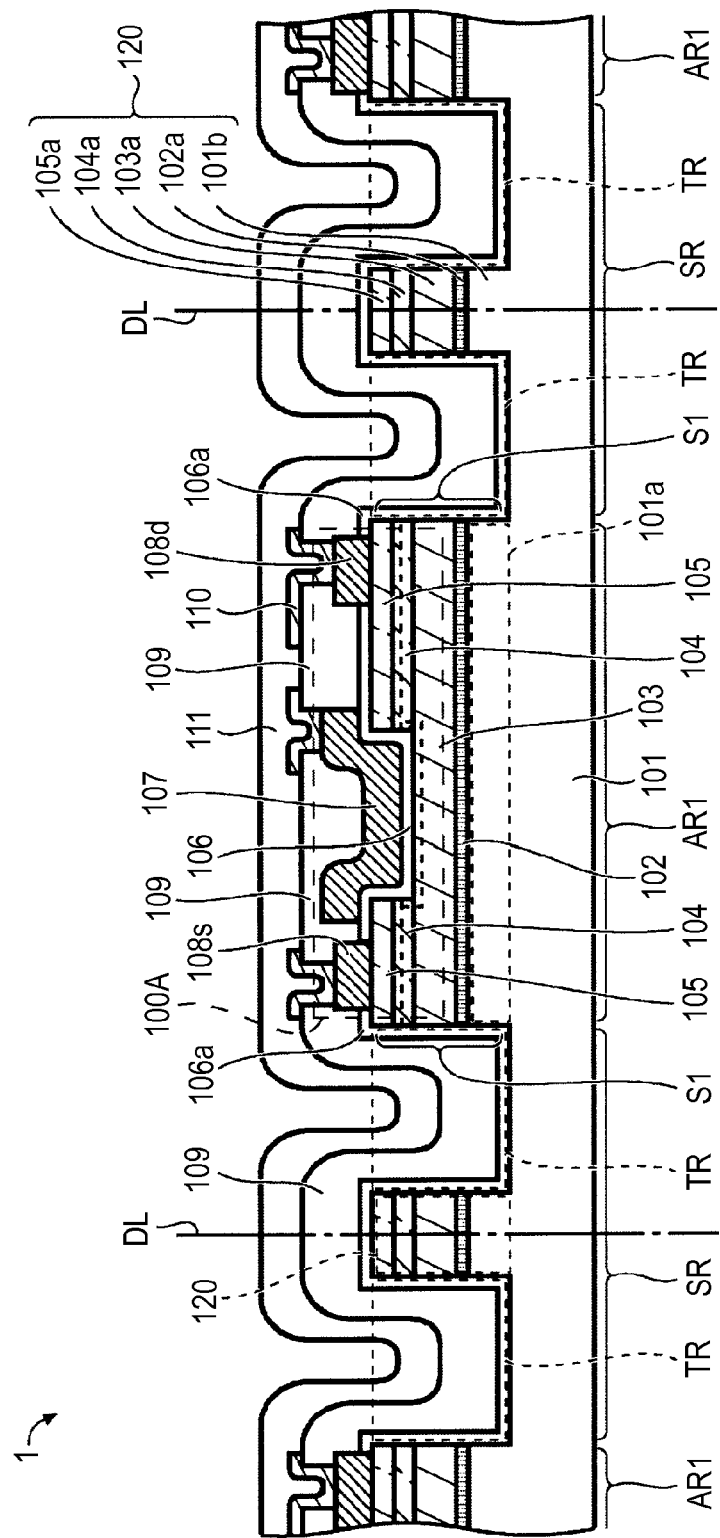
FIG. 2 is a diagrammatic view showing a layered structure of a cross-section A-A' in FIG. 1B.

FIG. 1A is a top view showing a schematic structure of a wafer 1 before separating the semiconductor devices 100 according to the present embodiment of the invention and FIG. 1B is an enlarged schematic top view around one semiconductor device 100 among the plurality of semiconductor devices 100 arrayed two-dimensionally on the wafer 1. FIG. 2 is a diagrammatic view showing a layered structure of a cross-section A-A' in FIG. 1B;

As shown in FIGS. 1A and 1B, the plurality of semiconductor devices 100 is formed while being arrayed two-dimensionally on the wafer 1 by using the WCSP technique for example. Each semiconductor device 100 has an element forming region AR1 in which a semiconductor element such as a MOSFET contained in the device is formed.

A scribing region SR that is a part to be cut in separating each semiconductor device 100 is set between the vertically or horizontally neighboring element forming regions AR1 and two parallel trenches TR are formed along a direction in which the scribing region SR extends. There exists a mesa-like convex portion 120 that extends along the direction in which the scribing region SR extends between the two trenches TR. The present embodiment separates the respective semiconductor devices 100 into individual chips by cutting the convex portion 120 between the two trenches TR by using a dicing blade or a laser cutter for example.

As shown in FIG. 2, one or more semiconductor elements including the MOSFET 100A composed of a p-type semiconductor layer 103 that functions as a channel layer during operation, a carrier drifting layer 104 and a carrier supplying layer 105 that generate two-dimensional electron gas that may be utilized as carrier by forming a hetero-junction interface, a gate insulating film 106 and a gate electrode 107 on the p-type semiconductor layer 103 that compose a MOS (Metal Oxide Semiconductor) structure, a source electrode 108s and a drain electrode 108d formed in two regions interposing the gate electrode 107 are formed on a buffer layer 102 formed on a convex portion 101a of a silicon substrate 101 in each element forming region AR1. It is noted that a case of forming one MOSFET 100A will be exemplified to simplify the explanation.

The wafer 1 of the present embodiment before separating the semiconductor devices into individual chips has the two trenches TR formed along the scribing region SR between the neighboring element forming regions AR1 and the convex portion 120 between the trenches TR as described above. The convex portion 120 between the trenches TR is cut along the direction in which it extends in separating the semiconductor devices. Then, a width $W_{conv}$ of a top surface of the convex portion 120 is set to be wider than a width to be removed during cutting that is determined by a thickness of the dicing blade or a spot diameter of the laser cutter for example. When the thickness of the dicing blade is around 100 μm for example, the width $W_{conv}$ of the top surface of the convex portion 120 is set to be around 200 μm or more. It allows physical or thermal damages otherwise given to the element forming region AR1 during cutting to be reduced. However, the invention is not limited to such a case and the width $W_{conv}$ of the top surface of the convex portion 120 may be set to be in the same range with or less than the thickness of the dicing blade or the spot diameter of the laser cutter. It allows an area to be used as the scribing region SR on the wafer 1 to be reduced, so that it becomes possible to increase an effective area usable as the element forming region AR1. It is noted that the mesa-like convex portion 120 formed between the two trenches TR includes a convex portion 101b that is an upper layer part of the silicon substrate 101 and part of various films 101a, 102a, 103a, 104a and 105a formed in fabricating the semiconductor element described above for example as shown in FIG. 2.

Because the width $W_{conv}$ of the top surface of the convex portion 120 is set to be wider than the thickness of the dicing blade or the spot diameter of the laser cutter used in separating the semiconductor devices in the present embodiment as described above, it is not necessary to widen a width $W_{TR}$ of each trench TR more than the thickness of the dicing blade or the spot diameter of the laser cutter. As a result, it becomes possible to fully narrow down the width $W_{TR}$ of the trench TR around to or less than 10 μm. It becomes also possible to uniformly form the photo-resist used in the photolithographic process in the microfabrication process by narrowing down the width as described above even if the step of forming the trench TR is placed before the microfabrication process. Still more, because it becomes unnecessary to place the step of forming the trench TR after the microfabrication process by this arrangement, it is also possible to avoid the fabrication process from being complicated.

Still more, the trench TR is formed down to an upper layer part of the silicon substrate 101 for example in the present embodiment. This structure allows the trench TR to function as a trench for separating the elements between the semiconductor devices 100 in the present embodiment. A depth of the trench may be around 9 μm from a top surface of the passivation film 111 for example. However, although the trench TR reaching the upper layer part of the silicon substrate 101 is exemplified in the present embodiment, the invention is not limited to that and it will do as long as the trench TR from the top of the p-type semiconductor layer 103 is formed along a cut surface (see a side surface S2 in FIG. 6B) created due to dicing between the cut surface and the element forming region AR1.

Still more, the trench TR as described above may be formed by anisotropic dry etching using chlorine gas for example in the present embodiment. Therefore, a side surface of the trench TR, i.e., a side surface S1 of the element forming region AR1, is a surface having less irregularities and less physical and thermal damages as compared to the surface (hereinafter referred to a dicer cut surface) created by using the dicing blade or the laser cutter for example. This structure allows a leak current otherwise leaked to the substrate (the silicon substrate 101 in the present embodiment) via the side surface S1 of the element forming region AR1 to be reduced, so that it becomes possible to realize the semiconductor device 100 having excellent characteristics by the present embodiment.

An interlayer insulating film 109 having contact holes for making electrical connection with the semiconductor elements is formed on the silicon substrate 101 on which the semiconductor elements, the trench TR and the convex portion 120 are formed as described above. It is noted that an inside of the trench TR and the convex portion 120 may be covered by an insulating film 106a formed in the same time when the gate insulating film 106 is formed for example as shown in FIG. 2. Still more, a metal layer 110 including an upper layer wire and in-contact wire is formed on the interlayer insulating film 109 and within the contact hole created therein. The passivation film 111 for electrically and physically protecting the under layers is formed on the interlayer insulating film 109. It is noted that a plurality of layers of the interlayer insulating film 109 and the metal layer 110 may be formed, respectively.

Various substrates such as a sapphire substrate for example may be applied as the substrate described above beside the silicon (111) substrate 101. The buffer layer 102 on the silicon substrate 101 is a layer for buffering an interaction caused by characteristic differences of the p-type semiconductor layer 103 to be grown above the buffer layer 102 and the silicon substrate 101 and for improving joint strength of the both layers. The buffer layer 102 as described above may be formed by forming an AlN (aluminum nitride) layer whose thickness is around 50 nm on the silicon substrate 101 and by laminating 20 to 80 layers of layered films each composed of a GaN layer whose thickness is around 5 to 100 nm for example and an AlN layer whose thickness is around 1 to 10 nm for example on the AlN layer previously formed. However, the invention is not limited to this structure and may be variously modified depending on materials and others of the semiconductor layer (the p-type semiconductor layer 103 in the present embodiment) formed on the buffer layer 102.

The p-type semiconductor layer 103 on the buffer layer 102 contains p-type impurities for example and forms a channel during operation as described above. The p-type semiconductor layer 103 described above may be formed by using various semiconductors such as III group nitride semiconductors like GaN, AlGaN, BAlGaN and InGaN and other compound semiconductors like GaAs, InP and SiGe. A case of forming the p-type semiconductor layer 103 by using the GaN layer will be illustrated in the present embodiment. Still more, a case of using magnesium (Mg) as the p-type impurity will be illustrated while setting its concentration (Mg concentration) at around $1 \times 10^{17}/cm^3$ for example in the present embodiment.

The carrier drifting layer 104 and the carrier supplying layer 105 on the p-type semiconductor layer 103 are layers that form a so-called HEMT structure and generate two-dimensional electron gas that may be utilized as carrier during the operation in the upper layer of the carrier drifting layer 104 near the interface by forming the hetero-junction interface as described above. In the present embodiment, an un-doped GaN (hereinafter referred to as un-GaN) layer for example is used as the carrier drifting layer 104 and an un-doped AlGaN (hereinafter referred to as un-AlGaN) layer for example is used as the carrier supplying layer 105. However, the invention is not limited to those layers and various compound semiconductor growth films capable of generating two-dimensional electron gas may be applied by forming the hetero-junction interface.

A part of the HEMT structure on the p-type semiconductor layer 103 (part of the carrier drifting layer 104 and the carrier supplying layer 105) is removed and the gate insulating film 106 and the gate electrode 107 are formed on the p-type semiconductor layer 103 in the removed part. This structure allows the MOSFET 100A of the present embodiment to have a MOS structure composed of the p-type semiconductor layer 103, the gate insulating film 106 and the gate electrode 107. In the present embodiment, a silicon oxide film for example is used for the gate insulating film 106 and a metal film having a deposited structure in which an aluminum (Al) film is sandwiched by upper and lower titanium (Ti) films for example is used for the gate electrode 107. However, the invention is not limited to them and the semiconductor element incorporated in the semiconductor device 100 may be a FET having a MIS (Metal Insulator Semiconductor) structure for example. Accordingly, various insulating films and conductive films may be used also for the gate insulating film 106 and the gate electrode 107.

The paired source and drain electrodes 108s and 108d are formed at two regions interposing the gate electrode 107 on the carrier supplying layer 105 as described above. In the present embodiment, a metal layer having a deposited structure composed of an underlying Ti film and an upper Al film for example for the source and drain electrodes 108s and 108d. However, the invention is not limited to them and those electrodes may be formed by using various conductors capable of ohmically junctioning with the carrier supplying layer 105 for example.

The interlayer insulating film 109 that covers the semiconductor elements may be formed by using insulating films such as a silicon oxide film for example. The metal layer 110 on the interlayer insulating film 109 and within the contact hole may be formed by using the metal film having the deposited structure composed of the Ti film and the Al film. Still more, the passivation film 111 covering them may be formed by using insulating films such as a silicon nitride film for example.

(Fabrication Method)

Next, a method for fabricating the semiconductor device 100 by the present embodiment will be explained in detail with reference to the drawings. FIGS. 3A through 6B are process diagrams showing the method for fabricating the semiconductor device 100 by the present embodiment. It is noted that FIGS. 3A through 6B show cross-sections corresponding to the cross-section shown in FIG. 2.

Figure 3A:
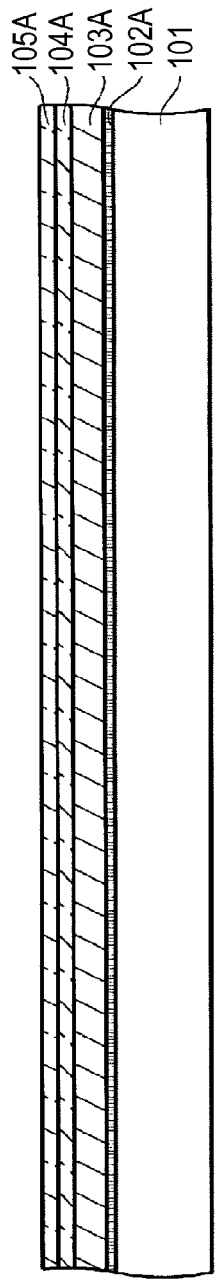
FIGS. 3A, 3B and 3C are process diagrams (part 1) showing a method for fabricating the semiconductor devices according to the first embodiment of the invention.

According to this method, a buffer layer 102A is formed on the silicon substrate 101 at first as shown in FIG. 3A and then a p-GaN layer 103A, an un-GaN layer 104A and an un-AlGaN layer 105A are formed one after another on the buffer layer 102A.

Specifically, trimethyl aluminum (TMA) and ammonium ($NH_3$) for example are introduced into a chamber of a MOCVD (Metal Organic Chemical Vapor Deposition) containing the silicon substrate 101 with flow rates of around 100 μmol/min and around 12 liters/min, respectively. Thereby, the AlN layer whose thickness is around 100 nm for example is epitaxially grown on the silicon substrate 101. Next, the GaN layer whose thickness is around 200 nm for example is epitaxially grown by introducing trimethyl gallium (TMG) and ammonium onto the grown AlN layer with flow rates of around 58 μmol/min and of around 12 liters/min, respectively. In succession, the AlN layer whose thickness is around 20 nm for example is epitaxially grown by introducing TMA and ammonium for example onto the grown GaN layer with the similar flow rates as described above. After that, the growth films each composed of the GaN layer whose thickness is around 200 nm and the AlN layer whose thickness is around 20 nm are superimposed by eight layers for example to form the buffer layer 102A having the growth structure whose total thickness from the undermost AlN layer is around 1860 nm for example on the silicon substrate 101.

Next, Bis(Cyclopentadienyl)Magnesium: CP2Mg) is introduced onto the buffer layer 102A beside the TMG and ammonium for example. Thereby, the GaN layer (p-GaN layer) 103A into which Mg is doped as the p-type impurity is epitaxially grown on the buffer layer 102A. It is noted that a thickness of the p-GaN layer 103A may be around 500 nm for example. Flow rates of the TMG and ammonium at this time may be around 19 μmol/min and 12 liters/min, respectively. A flow rate of the CP2Mg may be what achieves $1×10^{17}/cm^3$ of Mg concentration in the grown p-GaN layer 103A. Where, the Mg concentration is a result measured by a second ion mass spectroscopy (SIMS) for example.

Next, the un-GaN layer 104A whose thickness is around 100 nm for example is epitaxially grown by introducing TMG and ammonium onto the p-GaN layer 103A with flow rates of around 19 μmol/min and of around 12 liters/min, respectively. In succession, the un-AlGaN layer 105A whose thickness is around 20 nm for example is epitaxially grown by introducing TMA, TMG and ammonium onto the un-GaN layer 104A with flow rates of around 125 μmol/min, 19 μmol/min and of 12 liters/min, respectively. It is noted that a composition of the un-AlGaN layer 105A may be $AL_{0.25}Ga_{0.75}N$ for example. Growth temperature of each layer (the buffer layer 102A, the p-GaN layer 103A, the un-GaN layer 104A and the un-AlGaN layer 105A) in the abovementioned processes may be around 1050° C. for example.

Figure 3B:
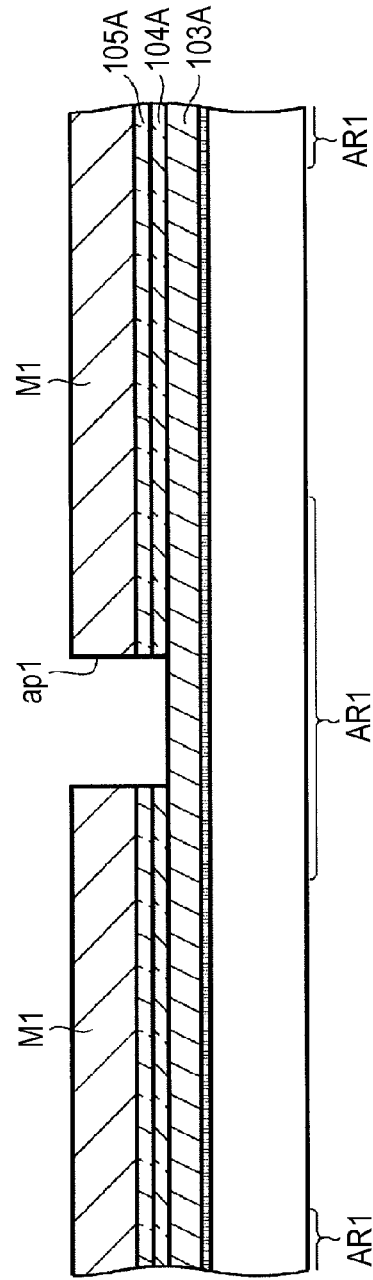

After forming the growth laminate film composed of the buffer layer 102A, the p-GaN layer 103A, the un-GaN layer 104A and the un-AlGaN layer 105A on the silicon substrate 101 as described above, a part of the un-AlGaN layer 105A and the un-GaN layer 104A in the element forming region AR1 is removed by using photolithographic and etching technologies for example as shown in FIG. 3B to expose a part of the underlying p-GaN layer 103A. Specifically, a silicon oxide film M1 whose thickness is around 300 nm for example is formed on the un-AlGaN layer 105A by using a CVD technique for example and a photo-resist in which a pattern for removing the un-AlGaN layer 105A and the un-GaN layer 104A is transferred is formed on the silicon oxide film M1 by using a photolithographic technique for example. Then, the removal pattern is transferred to the silicon oxide film M1 by processing the silicon oxide film M1 by means of wet etching using buffering hydrofluoric acid (BHF) or of dry etching using fluorinated gas for example while using the photo-resist as a mask. Thereby, an aperture ap1 is created through the silicon oxide film M1 as a result of the removal pattern. Next, after removing the photo-resist, the un-AlGaN layer 105A and the un-GaN layer 104A are etched one after another by means of dry etching using chlorine gas for example while using the silicon oxide film M1 as a mask to remove the un-AlGaN layer 105A and the un-GaN layer 104A under the aperture ap1 and to expose an upper surface of the p-GaN layer 103A. It is preferable to remove the un-GaN layer 104A under the aperture ap1 completely by etching overly more or less at this time. Still more, the un-GaN layer 104A and the un-AlGaN layer 105A that are located in regions not used as the semiconductor elements may be also removed in this process.

Figure 3C:
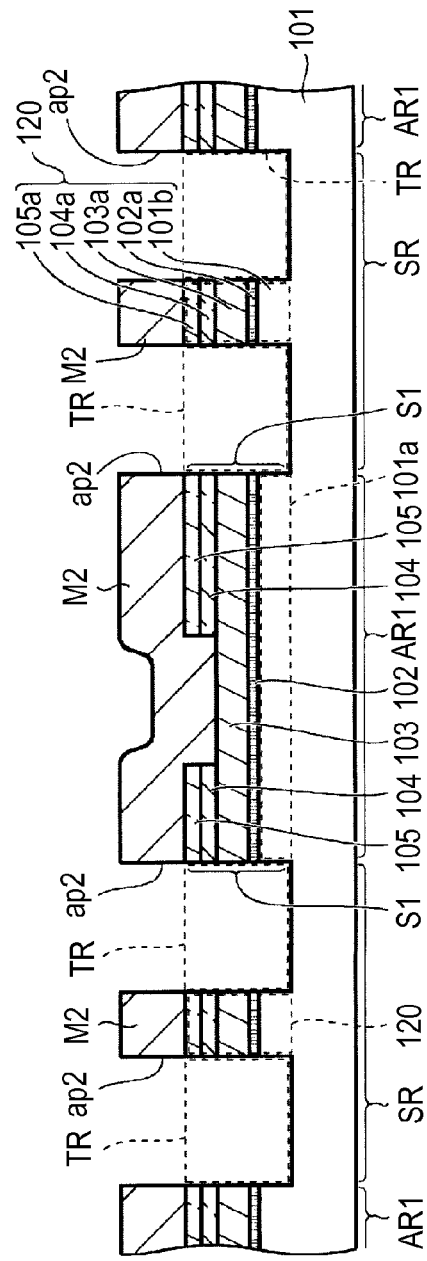

Next, after removing the silicon oxide film M1 used as the mask, two parallel trenches TR are formed between the element forming regions AR1 as shown in FIG. 3C by using photolithographic and etching techniques for example. Specifically, a silicon oxide film M2 having an aperture ap2 for forming the trench TR is formed on the un-AlGaN layer 105A and the exposed p-GaN layer 103A by using a process similar to the process explained by using FIG. 3B for example. It is noted that a thickness of the silicon oxide film M2 may be around 1000 nm for example. In succession, the two parallel trenches TR are formed in the scribing region SR (see FIGS. 1A and 1B) by etching the un-AlGaN layer 105A, the un-GaN layer 104A, the p-GaN layer 103A, the buffer layer 102A and an upper layer part of the silicon substrate 101 one after another by means of anisotropic dry etching such as RIE (Reactive Ion Etching) and ICP-RIE (Inductive Coupled Plasma-RIE) using chlorine gas for example while using the silicon oxide film M2 as a mask.

As a result of the process described above, the buffer layer 102A, the p-GaN layer 103A, the un-GaN layer 104A and the un-AlGaN layer 105A in the element forming region AR1 are shaped respectively as the buffer layer 102, the p-type semiconductor layer 103, the carrier drifting layer 104 and the carrier supplying layer 105 and the elements are separated between the element forming regions AR1. Still more, as a result of the process described above, the mesa-like convex portion 120 composed of the convex portion 101b that is the upper layer part of the silicon substrate 101, the buffer layer 102a that is a part of the buffer layer 102A, the p-GaN layer 103a that is a part of the p-GaN layer 103A, the un-GaN layer 104a that is a part of the un-GaN layer 104A and the un-AlGaN layer 105a that is a part of the un-AlGaN layer 105A is formed between the two trenches TR in each scribing region SR.

After forming the two trenches TR and the convex portion 120 in the scribing region SR as described above, the silicon oxide film M2 used as the mask is removed and a silicon oxide film whose thickness is around 60 nm for example and which covers the whole upper surface of the silicon substrate 101 on which the respective layers described above are formed is formed by using a CVD (Chemical Vapor Deposition) technique for example. In succession, the silicon oxide film is processed by using photolithographic and etching techniques to remove at least a part of the silicon oxide film on the carrier supplying layer 105 as shown in FIG. 4A to form apertures ap3 for contacting respectively with the source and drain electrodes 108s and 108d. It is noted that the silicon oxide film within the element forming region AR1 formed in this process will be represented as a gate insulating film 106 and the same silicon oxide film formed in this process in other regions will be represented as an insulating film 106a for convenience of explanation in the present embodiment.

Next, the source and drain electrodes 108s and 108d that ohmically contact with the carrier supplying layer 105 that is exposed by the aperture ap3 of the gate insulating film 106 are formed on the carrier supplying layer 105 as shown in FIG. 4B by using a lift-off method for example. Specifically, a photo-resist R1 having the aperture ap3 is formed in a region where the source and drain electrodes 108s and 108d are to be formed by using a photolithographic technology for example. In succession, Ti and Al are deposited one after another on the photo-resist R1 and the carrier supplying layer 105 exposed by the aperture ap3 by using a sputtering or vacuum evaporation method for example. Thereby, a metal film 1008 composed of deposited films of Ti and Al films is formed on the photo-resist R1 and the source and drain electrodes 108s and 108d are formed on the carrier supplying layer 105 exposed by the aperture ap3. It is noted that a thickness of the Ti film and that of the Al film may be around 25 nm and 300 nm, respectively. Then, the photo-resist R1 is removed by using a releasing solution such as acetone for example to remove the semiconductor device 1008 on the photo-resist R1 by means of a lift-off method. After that, an annealing treatment at 600° C. for example is carried out for about 10 minutes to ohmically contact the carrier supplying layer 105 with the source electrode 108s on a source side and the carrier supplying layer 105 with the drain electrode 108d on a drain side, respectively.

Figure 5A:
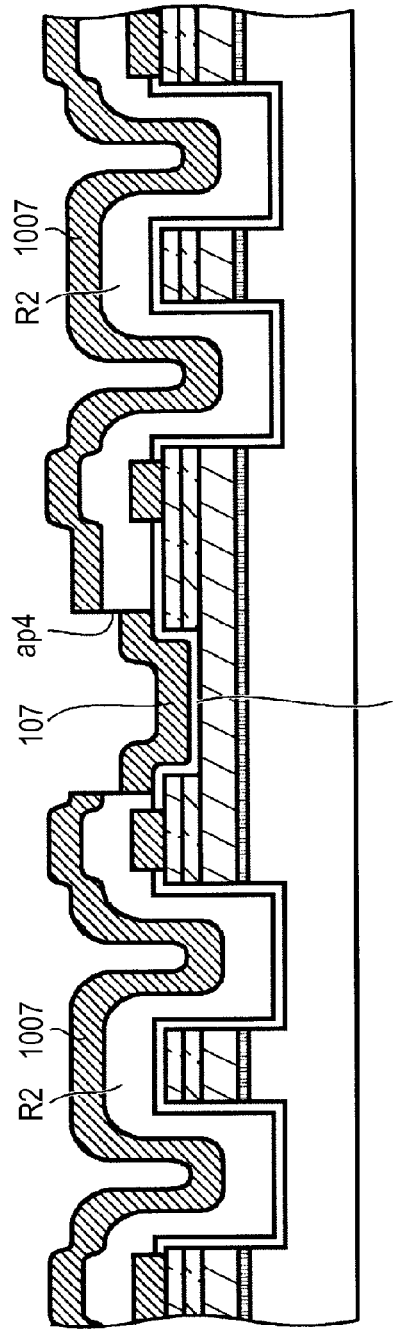
FIGS. 5A and 5B are process diagrams (part 3) showing the method for fabricating the semiconductor devices according to the first embodiment of the invention.

Next, a gate electrode 107 is formed on the gate insulating film 106 as shown in FIG. 5A by using a lift-off method for example. Specifically, a photo-resist R2 having an aperture ap4 is formed on a region where the gate electrode 107 is to be formed on the gate insulating film 106 by using a photolithographic technique for example. In succession, Ti, Al and Ti are deposited one after another on the photo-resist R2 and the gate insulating film 106 exposed by the aperture ap4 by using a sputtering or vacuum evaporation method for example. Thereby, a metal film 1007 composed of deposited films of Ti, Al and Ti films is formed on the photo-resist R2 and the gate electrodes 107 is formed on the gate insulating film 106 exposed by the aperture ap4. It is noted that thicknesses of the underlying Ti film, the Al film and the upper Ti film may be around 25 nm, 300 nm and 25 nm, respectively. Then, the photo-resist R2 is removed by using a releasing solution such as acetone for example to remove the metal film 1007 on the photo-resist R2 by means of a lift-off method.

Figure 5B:
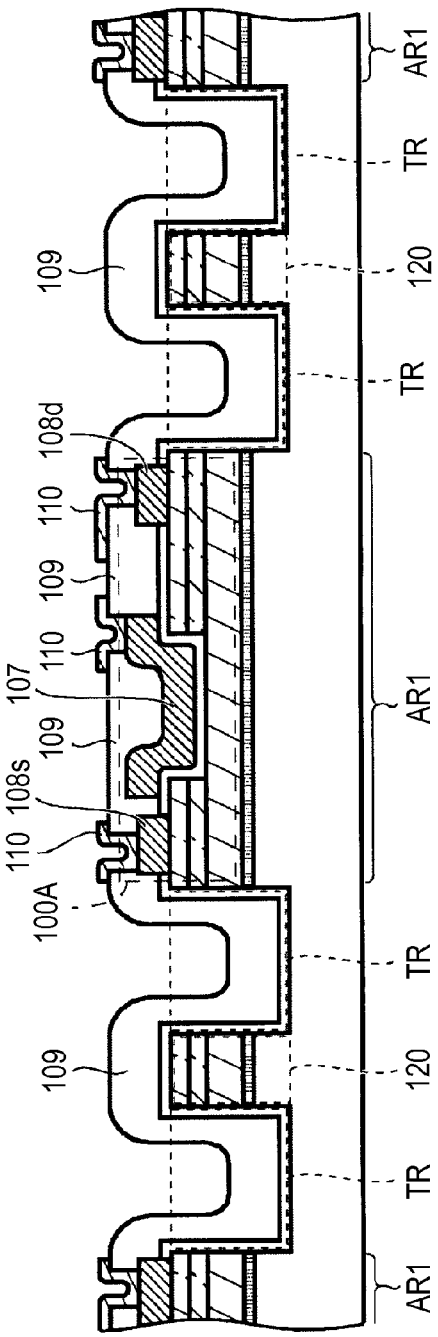

After forming the semiconductor element containing the MOSFET 100A composed of the p-type semiconductor layer 103, the carrier drifting layer 104, the carrier supplying layer 105, the gate insulating film 106, the gate electrode 107, the source and drain electrodes 108s and 108d in the element forming region AR1 as described above, the interlayer insulating film 109 whose thickness is around 3000 nm for example and which cover the whole upper surface of the silicon substrate 101 on which the respective layers are formed is formed by depositing silicon oxide by using a CVD technique for example. In succession, the contact holes that expose each part of the source and drain electrodes 108s and 108d as well as that of the gate electrode 107 are created through the interlayer insulating film 109 by using the photolithographic and etching techniques. Next, the metal layer 110 including the upper layer wire on the interlayer insulating film 109 and the in-contact wire within the contact hole is formed as shown in FIG. 5B by using a sputtering or vacuum evaporation method for example. It is noted that the interlayer insulating film 109 and the metal layer 110 are not limited to be one layer each and a plurality of layers may be formed, respectively.

Next, the passivation film 111 whose thickness is around 800 nm for example is formed on the interlayer insulating film 109 and the metal layer 110 as shown in FIG. 6A by depositing silicon nitride by means of a CVD technique for example. It is noted that as a result of this process, the wafer 1 having the layered structure as shown in FIG. 2 is fabricated.

Next, after pasting a dicing sheet DS having an adhesive surface for example on the back of the silicon substrate 101 on which the respective layers are formed and fixing it on a dicing table not shown, the convex portion 120 in the scribing region SR of the silicon substrate 101 is cut by using a dicing blade DB for example as shown in FIG. 6B. At this time, the silicon substrate 101 is cut along a dicing line DL (see FIG. 2) from the top surface of the substrate. Thereby, the semiconductor devices 100 on the wafer 1 shown in FIGS. 1A, 1B and 2 are separated into individual chips. It is noted that although the present embodiment separates the semiconductor devices 100 into individual chips by using the dicing blade DB as described above, the invention is not limited to that and the semiconductor devices 100 may be separated into individual chips by means of stealth cut using a laser cutter for example. Still more, although the case in which the width $W_{conv}$ of the top surface of the convex portion 120 is set to be larger than a thickness of the dicing blade DB is illustrated in FIG. 6B, the invention is not limited to such a case as described above.

The semiconductor device 100 after being separated has a convex portion 120a that is a part of the convex portion 120 around an outer edge and the trench TR formed between the convex portion 120a and the element forming region AR1 as shown in FIG. 6B by fabricating the semiconductor device 100 by using the processes described above. Although the side surface S2 that is a surface where the semiconductor device 100 is separated is a surface cut by the dicer, the side surface S1 of the element forming region AR1 is a surface having excellent characteristics because it is formed by etching and has less irregularities and physical and thermal damages. Therefore, it becomes possible to reduce a leak current otherwise leaking through the side surface S1 of the element forming region AR1 and to fabricate the semiconductor device 100 having the excellent characteristics.

Figure 7:
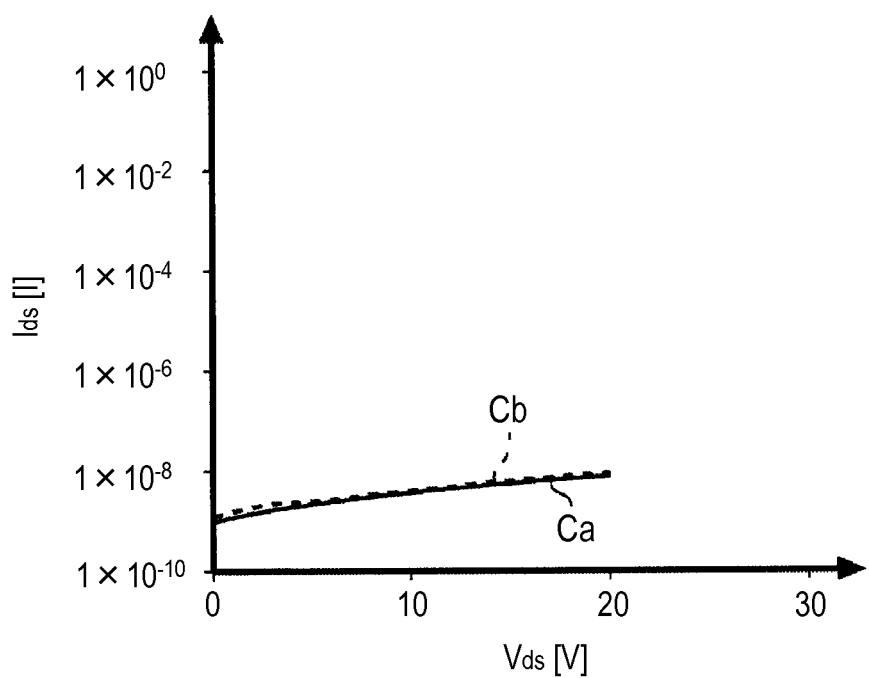
FIG. 7 is a graph showing current-voltage characteristics of the semiconductor devices after and before separation according the first embodiment of the invention.

FIG. 7 shows current-voltage characteristics of the semiconductor device 100 after the separation fabricated as described above and of the semiconductor device 100 formed on the wafer 1 before the separation. As shown in FIG. 7, the current-voltage characteristic Ca of the semiconductor device 100 after the separation shows the same degree of excellent characteristics with the current-voltage characteristic Cb of the semiconductor device 100 before the separation.

It is noted that although the case of forming the trench TR on the top surface of the silicon substrate 101, i.e., on the element forming surface, has been illustrated in the embodiment described above, the invention is not limited to that and may be arranged so as to form the trench TR from the back of the silicon substrate 101 for example. In this case, the trench TR is formed so that it reaches at least to the carrier supplying layer 105 from the back of the silicon substrate 101.

Second Embodiment

Next, a semiconductor device 200 of the second embodiment of the invention will be explained in detail with reference to the drawings. It is noted that the semiconductor device 200 on which one or more HEMT 200A are formed as semiconductor elements will be exemplified in the present embodiment. It is also noted that in the explanation below, the same structures with those of the first embodiment will be denoted by the same reference numerals and their detailed explanation will be omitted.

(Structure)

Figure 8:
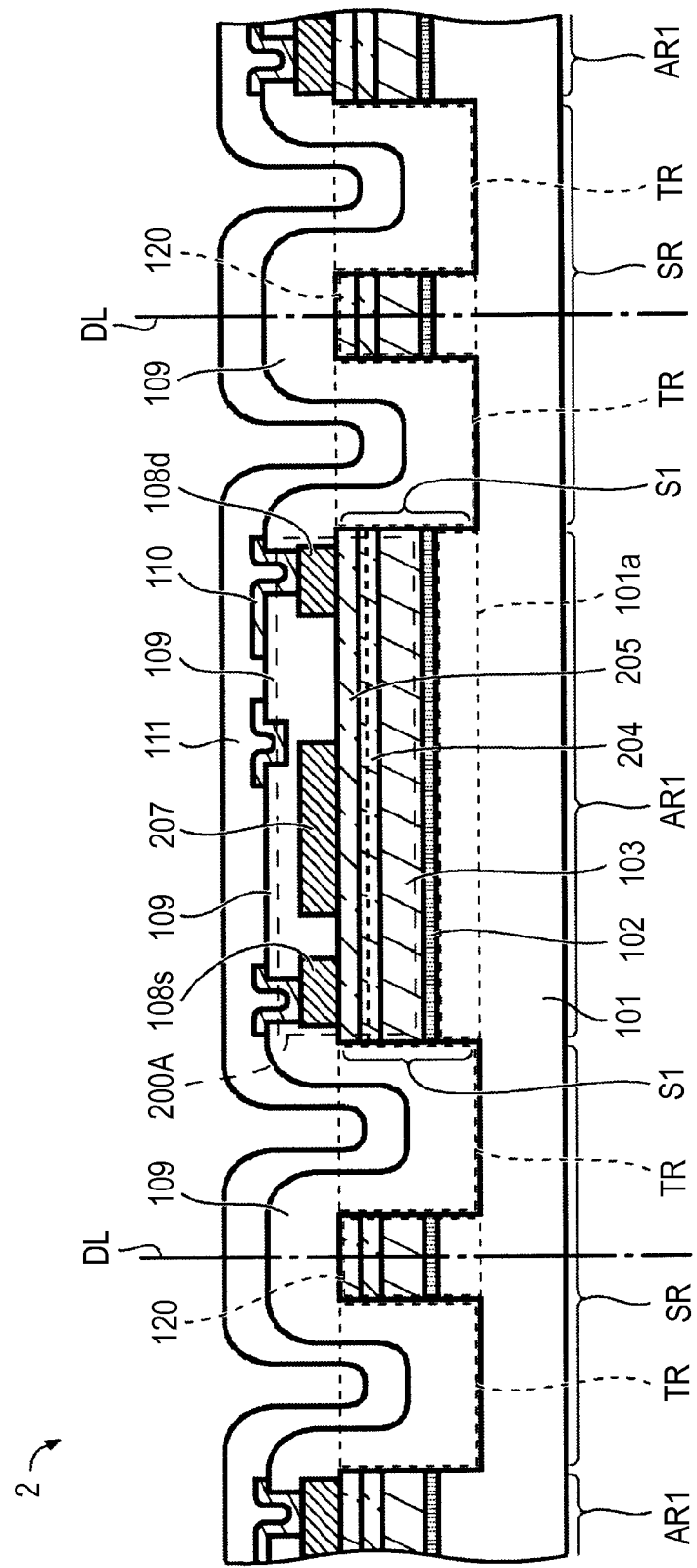
FIG. 8 is a diagrammatic view showing a layered structure of a wafer on which semiconductor devices are formed according to a second embodiment of the invention.

A structure of a wafer 2, seen from its top, before the semiconductor devices 200 are separated into individual chips in the present embodiment is the same with the structure shown in FIGS. 1A and 1B in outline, so that the structure shown in FIGS. 1A and 1B will be cited and its detailed explanation will be omitted here. FIG. 8 is a diagrammatic view showing a layered structure of the wafer 2 and shows the layered structure of a cross-section corresponding to the cross-section A-A' in FIG. 1B.

As it is apparent when FIG. 8 is compared with FIG. 2, a HEMT 200A formed in each element forming region AR1 in the present embodiment has a structure in which a carrier drifting layer 204 and a carrier supplying layer 205 are not removed in a region where a gate electrode 207 is formed in the similar structure with the MOSFET 100A of the first embodiment. Still more, the HEMT 200A has a structure in which the gate electrode 107 in the MOSFET 100 is omitted and the gate electrode 107 is replaced with a gate electrode 207 that Schottky-contacts with the carrier supplying layer 205. It is noted that because the gate insulating film 106 is eliminated, the insulating film 106a formed in the region outside of the element forming region AR1 is also eliminated. The other structures are the same with those of the first embodiment of the invention, so that they are denoted by the same reference numerals and their detailed explanation will be omitted here.

The gate electrode 207 is formed on the carrier supplying layer 205 and Schottky-contacts with it as described above. A metal film having a deposited structure composed of an underlying nickel (Ni) layer and an upper gold (Au) film for example may be used for the gate electrode 207. However, the invention is not limited to that and the gate electrode 207 may be formed by using various conductors capable of Schottky-contacting with the underlying carrier supplying layer 205 for example.

The carrier drifting layer 204 and the carrier supplying layer 205 may be formed by using the same material with the carrier traveling layer 104 and the carrier drifting layer 105 of the first embodiment of the invention, so that their detailed explanation will be omitted here.

(Fabrication Method)

Figure 9:
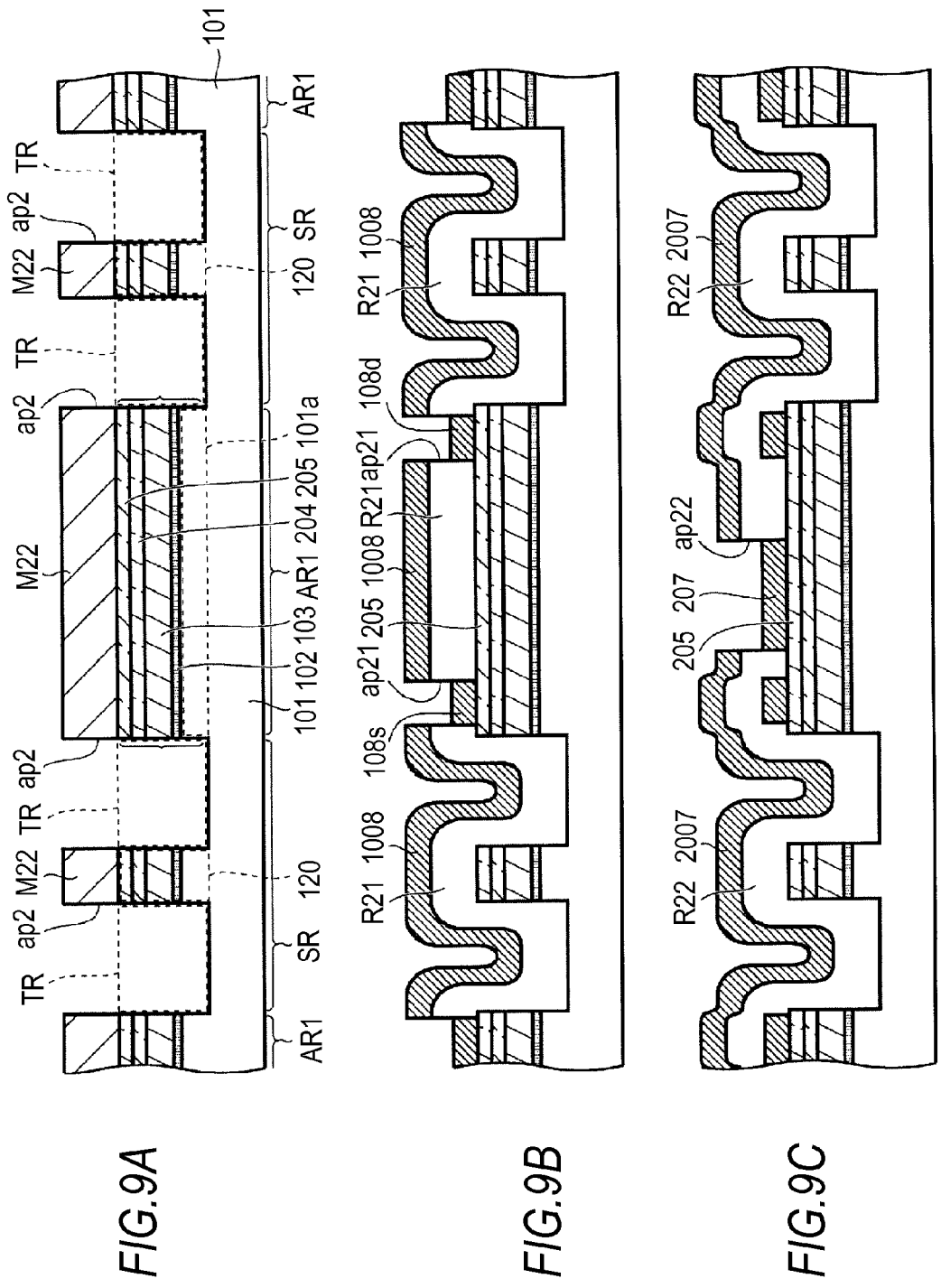
FIGS. 9A, 9B and 9C are process diagrams showing a method for fabricating the semiconductor devices according to the second embodiment of the invention.

Next, a method for fabricating the semiconductor device 200 of the present embodiment will be explained in detail with reference to the drawings. FIGS. 9A through 9C are process diagrams showing the method for fabricating the semiconductor device 200 of the present embodiment. It is noted that an explanation of the same processes with those of the first embodiment will be simplified by referring to the first embodiment.

According to this method, the buffer layer 102A, the p-GaN layer 103A, the un-GaN layer 104A and the un-AlGaN layer 105A are formed at first one after another on the silicon substrate 101 by using the same processes with those explained by using FIG. 3A in the first embodiment.

Next, the two parallel trenches TR are formed between the element forming regions AR1 as shown in FIG. 9A by using the same processes with the processes explained by using FIG. 3C in the first embodiment. It is noted that as a result of these processes, the buffer layer 102A, the p-GaN layer 103A, the un-GaN layer 104A and the un-AlGaN layer 105A in the element forming region AR1 are shaped as the buffer layer 102, the p-type semiconductor layer 103, the carrier traveling layer 204 and the carrier supplying layer 205, respectively, and the elements are separated between the element forming regions AR1. Still more, similarly to FIG. 3C of the first embodiment, the mesa-like convex portion 120 composed of the convex portion 101b that is the upper layer part of the silicon substrate 101, the buffer layer 102a that is a part of the buffer layer 102A, the p-GaN layer 103a that is a part of the p-GaN layer 103A, the un-GaN layer 104a that is a part of the un-GaN layer 104A and the un-AlGaN layer 105a that is a part of the un-AlGaN layer 105A is formed between the two trenches TR in each scribing region SR.

Next, the source and drain electrodes 108s and 108d that ohmically contact with the carrier supplying layer 205 are formed on the carrier supplying layer 205 as shown in FIG. 9B by using the same process with the lift-off process explained by using FIG. 4A in the first embodiment after removing the silicon oxide film M22 used as a mask. It is noted that the semiconductor device 1008 on the photo-resist R21 is removed by the lift-off by removing the photo-resist R21 used as the mask by using a releasing solution such as acetone for example and the source and drain electrodes 108s and 108d formed within the aperture ap21 remain.

Next, the gate electrode 207 is formed in the region interposed between the source and drain electrodes 108s and 108d on the carrier supplying layer 205 as shown in FIG. 9C by using the lift-off method for example. Specifically, the photo-resist R22 having an aperture ap22 is formed in the region interposed between the source and drain electrodes 108s and 108d by using the photolithographic technique for example. In succession, Ni and Au are deposited one after another on the photo-resist R22 and the carrier supplying layer 205 exposed by the aperture ap22 by using a sputtering or vacuum evaporation method for example. Thereby, a semiconductor device 2007 composed of deposited films of Ni films and Au films is formed on the photo-resist 22 and the gate electrode 207 that Schottky-junctions with the carrier supplying layer 205 is formed on the carrier supplying layer 205. It is noted that thicknesses of the Ni film and Au film are around 100 nm and 200 nm for example, respectively. It is noted that the semiconductor device 2007 on the photo-resist R22 is removed by means of the lift-off method by removing the photo-resist R22 used as the mask and the gate electrode 207 thus formed remains within the aperture ap22.

After that, the interlayer insulating film 109, the passivation film 111 and the passivation film 111 are formed one after another by using the same processes with those explained by using FIGS. 5B through 6A in the first embodiment of the invention. Then, the semiconductor devices 200 on the wafer 2 (see FIG. 8) on which the respective layers described above are formed are separated into individual chips by using the same processes with those explained by using FIG. 6B in the first embodiment. It is noted that the width $W_{conv}$ of the top surface of the convex portion 120 may be equal to or smaller than the thickness of the dicing blade DB or the spot diameter of the laser cutter.

Even if the semiconductor device 200 is fabricated as described above by forming the trenches TR for separation before the microfabrication process in the same manner with the first embodiment, it becomes possible to uniformly form the photo-resist used in the photolithography in the microfabrication process. Still more, the side surface of the trench TR, i.e., the side surface S1 of the element forming region AR1 is a surface formed by etching with less irregularities and less physical and thermal damages than the surface cut by the dicer, so that it becomes possible to reduce a leak current otherwise leaked to the substrate (the silicon substrate 101 in the present embodiment) through the side surface S1 of the element forming region AR1 and to realize the semiconductor device 200 having the excellent characteristics.

Third Embodiment

Next, a semiconductor device 300 of a third embodiment of the invention will be explained in detail with reference to the drawings. It is noted that the semiconductor device 300 on which one or more SBDs 300A are formed as semiconductor elements will be exemplified in the present embodiment. It is also noted that the same or corresponding structures with those in the first or second embodiment will be denoted by the same reference numerals and their detailed explanation will be omitted here.

(Structure)

Figure 10:
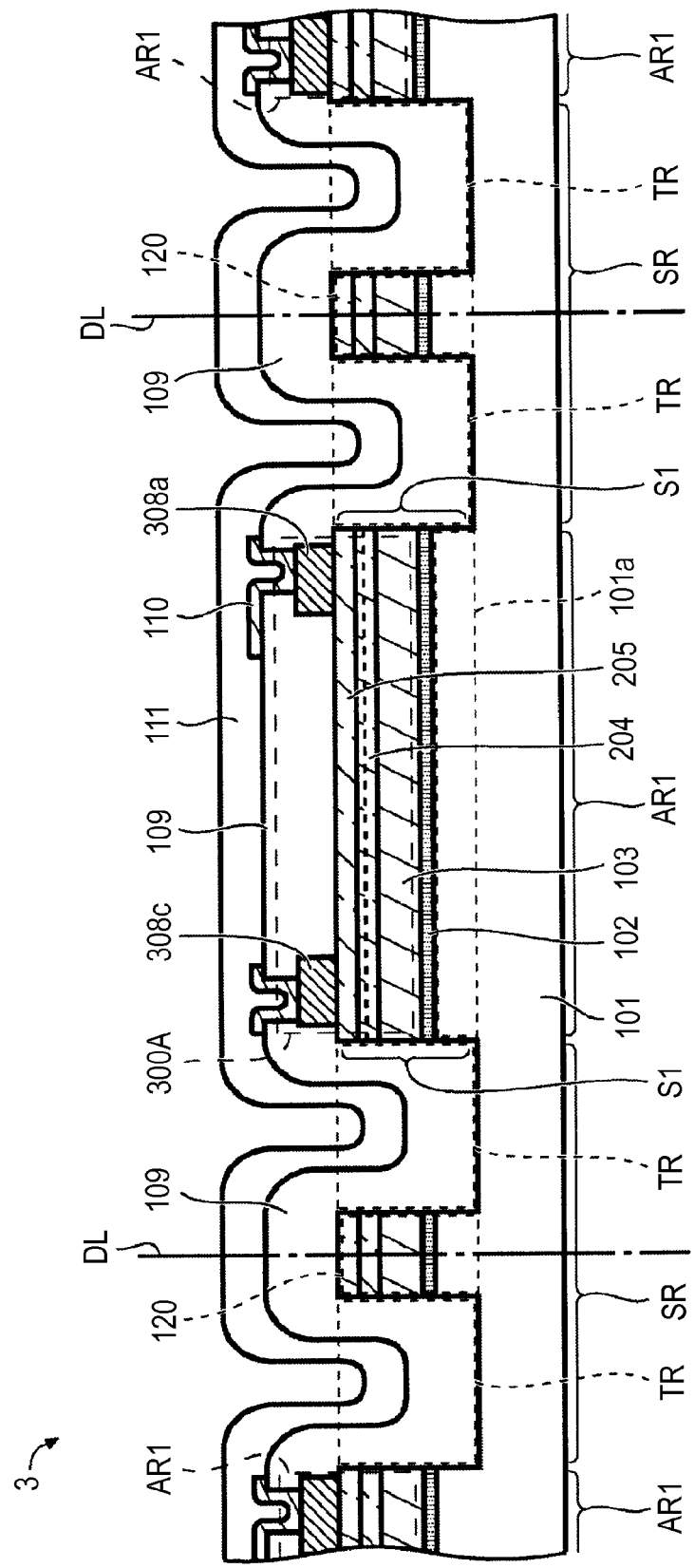
FIG. 10 is a diagrammatic view showing a layered structure of a wafer on which semiconductor devices are formed according to a third embodiment of the invention.

Skelton structures above a wafer 3 before separating into the individual semiconductor devices 300 of the present embodiment is the same with those shown in FIGS. 1A and 1B of the first embodiment, so that the first embodiment will cited and their detailed explanation will be omitted here. FIG. 10 is a diagrammatic view showing a layered structure of the wafer 3 of the present embodiment. It is noted that FIG. 10 shows the layered structure of a cross-section corresponding to the cross-section A-A' in FIG. 1B.

As it is apparent when FIG. 10 is compared with FIGS. 2 and 8, a SBD 300A formed on each element forming region AR1 and having the similar structure with the HEMT 200A of the second embodiment has a structure in which the gate electrode 207 on the carrier supplying layer 205 is omitted and the source and drain electrodes 108s and 108d on the carrier supplying layer 205 are replaced with cathode and anode electrodes 308c and 308a in the present embodiment. The other structures are the same with those of the first or second embodiment, so that they will be denoted by the same reference numerals and their detailed explanation will be omitted here.

The cathode electrode 308c is an electrode made of a metal film that ohmically contacts with the carrier supplying layer 205. A metal film having a deposited structure composed of an underlying Ti film and an upper Al film for example is used in the present embodiment. However, the invention is not limited to that and the cathode electrode 308c may be formed by using various conductors that are capable of ohmically contacting with the underlying carrier supplying layer 205.

The anode electrode 308a is an electrode made of a metal film that Schottky-contacts with the carrier supplying layer 205. A metal film having a deposited structure composed of an underlying Ni film and an upper Al film for example is used in the present embodiment. However, the invention is not limited to that and the anode electrode 308a may be formed by using various conductors that are capable of Schottky-contacting with the underlying carrier supplying layer 205.

(Fabrication Method)

A method for fabricating the semiconductor device 300 of the present embodiment will be explained in detail below with reference to the drawings. FIGS. 11A and 11B are process diagrams showing the method for fabricating the semiconductor device 300 of the present embodiment. It is noted that in the following explanation, an explanation of the same processes with those of the first or second embodiment of the invention will be simplified by citing those in the first or second embodiment.

In the method of the present embodiment, the buffer layer 102A, the p-GaN layer 103A, the un-GaN layer 104A and the un-AlGaN layer 105A are formed at first one after another on the silicon substrate 101 by using the same processes with those explained by using FIG. 3A.

Next, the two parallel trenches TR as shown in FIG. 9A in the second embodiment are formed between the element forming regions AR1 by using the same processes with those explained by using FIG. 3C in the first embodiment of the invention. It is noted that as a result of these processes, the buffer layer 102A, the p-GaN layer 103A, the un-GaN layer 104A and the un-AlGaN layer 105A in the element forming region AR1 are shaped as the buffer layer 102, the p-type semiconductor layer 103, the carrier traveling layer 204 and the carrier supplying layer 205, respectively, and the elements are separated between the element forming regions AR1. Still more, the mesa-like convex portion 120 composed of the convex portion 101b that is the upper layer part of the silicon substrate 101, the buffer layer 102a that is a part of the buffer layer 102A, the p-GaN layer 103a that is a part of the p-GaN layer 103A, the un-GaN layer 104a that is a part of the un-GaN layer 104A and the un-AlGaN layer 105a that is a part of the un-AlGaN layer 105A is formed between the two trenches TR in each scribing region SR.

Next, the cathode electrode 308c that ohmically contacts with the carrier supplying layer 205 is formed on the carrier supplying layer 205 as shown in FIG. 11B by using the same process with the lift-off process explained by using FIG. 4A in the first embodiment. It is noted that the metal film 300B on a photo-resist R31 is removed by the lift-off by removing the photo-resist R31 used as the mask by using a releasing solution such as acetone for example and the cathode electrode 308c formed within an aperture ap31 remains.

Next, an anode electrode 308a that Schottky-contacts with the carrier supplying layer 205 is formed on the carrier supplying layer 205 as shown in FIG. 11B by using the same process with the lift-off process explained by using FIG. 9C in the second embodiment. It is noted that a metal film 301B on a photo-resist R32 is removed by the lift-off by removing the photo-resist R32 used as the mask by using a releasing solution such as acetone for example and the anode electrode 308a formed within an aperture ap32 remains.

After that, the interlayer insulating film 109, the passivation film 111 and the passivation film 111 are formed one after another by using the same processes with those explained by using FIGS. 5B through 6A in the first embodiment of the invention. Then, the semiconductor devices 300 on the wafer 3 (see FIG. 10) on which the respective layers described above are formed are separated into individual chips by using the same processes with those explained by using FIG. 6B in the first embodiment. It is noted that the width $W_{conv}$ of the top surface of the convex portion 120 may be equal to or smaller than the thickness of the dicing blade DB or the spot diameter of the laser cutter also in the present embodiment similarly to the first embodiment.

Even if the semiconductor device 300 is fabricated as described above by forming the trenches TR for separation before the microfabrication process in the same manner with the first or second embodiment, it becomes possible to uniformly form the photo-resist used in the photolithography in the microfabrication process. Still more, the side surface of the trench TR, i.e., the side surface S1 of the element forming region AR1 is a surface formed by etching with less irregularities and less physical and thermal damages than the surface cut by the dicer, so that it becomes possible to reduce a leak current otherwise leaked to the substrate (the silicon substrate 101 in the present embodiment) through the side surface S1 of the element forming region AR1 and to realize the semiconductor device 300 having the excellent characteristics.

Thus, the invention has the structure in which the trench whose width is relatively narrow may be formed between the separation surface and the element forming region, not the structure that requires a trench whose width is wider than the thickness of the dicing blade or the diameter of a laser spot across the whole scribing region, so that it becomes possible to realize the semiconductor device and the method for fabricating the wafer structure and the semiconductor device that allow the photo-resist used in the photolithography in the microfabrication process even if the trench for the separation is formed before the microfabrication process.

What is claimed is:

1. A semiconductor device comprising:
    a substrate;
    a buffer layer formed on the substrate;
    an element forming region including at least one semiconductor element formed on the buffer layer; and
    a trench formed between an outer edge of the semiconductor device and the element forming region, wherein two-dimensional electron gas is formed in the buffer layer,
    the trench is formed at least to reach the substrate and spatially separates the two-dimensional electron gas in the buffer layer,
    a height of the trench on a first side adjacent to the outer edge and a height of the trench on a second side adjacent to the element forming region are on a same level, and
    an insulating layer is formed on a bottom surface of the trench.

2. The semiconductor device according to claim 1, wherein the trench is formed to penetrate into at least a portion of the substrate.

3. The semiconductor device according to claim 1, wherein the at least one compound semiconductor includes at least one of gallium nitride (GaN), aluminum gallium nitride (AlGaN), boron aluminum gallium nitride (BAlGaN), indium gallium nitride (InGaN), gallium arsenide (GaAs), indium phosphide (InP), or silicon germanium (SiGe).

4. The semiconductor device according to claim 1, wherein the at least one semiconductor element includes at least one of a metal oxide semiconductor field effect transistor (MOSFET), a high electron mobility transistor (HEMT), or a Schottky barrier diode (SBD).

5. A wafer structure formed of at least one compound semiconductor layer on a buffer layer formed on a substrate, the wafer structure comprising:
   a plurality of element forming regions that respectively comprise at least one semiconductor element;
   a plurality of scribing regions respectively disposed between two adjacent element forming regions of the plurality of element forming regions;
   two parallel trenches formed in respective scribing regions of the plurality of scribing regions, wherein the two parallel trenches spatially separate the at least one compound semiconductor layer between neighboring element forming regions of the plurality of element forming regions; and
   a mesa portion formed by the two parallel trenches, wherein
   two-dimensional electron gas is formed in the buffer layer,
   the two parallel trenches are formed at least to reach the substrate and spatially separate the two-dimensional electron gas in the buffer layer,
   a height of one of the two parallel trenches on a first side adjacent to the mesa portion and a height of the one of the two parallel trenches on a second side adjacent to one of the neighboring element forming regions are on a same level, and
   an insulating layer is formed on respective bottom surfaces of the two parallel trenches.

6. The semiconductor device according to claim 1, wherein a width of the trench is equal to or narrower than 10 micrometers.

7. The wafer structure according to claim 5, wherein the two parallel trenches are formed to penetrate into at least a portion of the substrate.

8. The wafer structure according to claim 5, wherein the at least one compound semiconductor layer includes at least one of gallium nitride (GaN), aluminum gallium nitride (AlGaN), boron aluminum gallium nitride (BAlGaN), indium gallium nitride (InGaN), gallium arsenide (GaAs), indium phosphide (InP), or silicon germanium (SiGe).

9. The wafer structure according to claim 5, wherein the at least one semiconductor element includes at least one of a metal oxide semiconductor field effect transistor (MOSFET), a high electron mobility transistor (HEMT), or a Schottky barrier diode (SBD).

10. The wafer structure according to claim 5, wherein a width of at least one of the two parallel trenches is equal to or narrower than 10 micrometers.

11. The wafer structure according to claim 5, wherein a width of the mesa portion is wider than a thickness of a dicing blade in or a spot size of a laser cutter.

12. The semiconductor device according to claim 1, wherein a same insulating layer structure of the insulating layer is formed on the bottom surface of the trench and on at least a part of the element forming region.

13. The semiconductor device according to claim 1, wherein the buffer layer contains a plurality of layered stacks respectively comprising a gallium nitride (GaN) layer and an aluminum nitride (AlN) layer, and
   the two-dimensional electron gas generated between the GaN layer and the AlN layer is spatially separated by the trench.

14. The wafer structure according to claim 5, wherein the buffer layer contains a plurality of layered stacks respectively comprising a gallium nitride (GaN) layer and an aluminum nitride (AlN) layer, and
   the two-dimensional electron gas generated between the GaN layer and the AlN layer is spatially separated by the two parallel trenches.

* * * * *